United States Patent
Mäki et al.

(10) Patent No.: US 10,841,009 B2
(45) Date of Patent: Nov. 17, 2020

(54) ARRANGEMENT FOR CATV NETWORK

(71) Applicant: Teleste Oyj, Littoinen (FI)

(72) Inventors: Kari Mäki, Turku (FI); Timo Lummejoki, Ilmarinen (FI); Anssi Mäkiranta, Masku (FI)

(73) Assignee: Teleste Oyj, Littoinen (FI)

( * ) Notice: Subject to any disclaimer, the term of this patent is extended or adjusted under 35 U.S.C. 154(b) by 8 days.

(21) Appl. No.: 16/090,324

(22) PCT Filed: Apr. 15, 2016

(86) PCT No.: PCT/FI2016/050253
§ 371 (c)(1),
(2) Date: Oct. 3, 2018

(87) PCT Pub. No.: WO2017/178691
PCT Pub. Date: Oct. 19, 2017

(65) Prior Publication Data
US 2020/0036445 A1 Jan. 30, 2020

(51) Int. Cl.
*H04B 10/2575* (2013.01)
*H03H 7/48* (2006.01)
(Continued)

(52) U.S. Cl.
CPC ....... *H04B 10/25751* (2013.01); *H03H 7/482* (2013.01); *H03J 5/246* (2013.01);
(Continued)

(58) Field of Classification Search
CPC .............................................. H04B 10/25751
See application file for complete search history.

(56) References Cited

U.S. PATENT DOCUMENTS

| 6,091,301 A | 7/2000 | Vogt |
| 2008/0235750 A1 | 9/2008 | Urbanek |

(Continued)

FOREIGN PATENT DOCUMENTS

| EP | 2991248 A2 * | 2/2016 | ............ H04H 20/78 |
| EP | 2991248 A2 | 3/2016 | |

OTHER PUBLICATIONS

Cable Television Laboratories, Inc; Data-Over-Cable Service Interface Specifications DOCSIS® 3.1 Physical Layer Specification, CM-SP-PHYv3.1-I08-151210; Dec. 10, 2015 [online], [retrieved Dec. 6, 2019]. Retrieved from the Internet <URL: https://specification-search.cablelabs.com/CM-SP-PHYv3.1> (Year: 2015).*

(Continued)

*Primary Examiner* — Nathan M Cors
(74) *Attorney, Agent, or Firm* — Berggren LLP

(57) ABSTRACT

A network element (200) of a cable television (CATV) network, comprising an input (204) for upstream signal transmission; at least two diplex filters (210, 212, 214) configured to be connected to said input (204), a first diplex filter (210) comprising a bandpass filter for a first upstream frequency band and a second diplex filter (212) comprising a bandpass filter for a second upstream frequency band; a switch (208) for connecting one of said at least two diplex filters to said input; wherein the network element is configured to be remotely controlled by a headend of the CATV network for selecting the diplex filter.

7 Claims, 1 Drawing Sheet

(51) Int. Cl.
  *H03J 5/24*    (2006.01)
  *H03J 9/00*    (2006.01)
  *H04H 20/78*   (2008.01)
  *H04L 12/28*   (2006.01)
  *H04N 21/61*   (2011.01)

(52) U.S. Cl.
  CPC .............. *H03J 9/00* (2013.01); *H04H 20/78* (2013.01); *H04L 12/2801* (2013.01); *H04N 21/6118* (2013.01); *H04N 21/6168* (2013.01)

(56) References Cited

U.S. PATENT DOCUMENTS

| | | |
|---|---|---|
| 2009/0133095 A1 | 5/2009 | Phillips |
| 2010/0251314 A1 | 9/2010 | Olson |
| 2010/0251320 A1 | 9/2010 | Shafer |
| 2016/0006407 A1 | 1/2016 | Brooks |
| 2016/0286268 A1* | 9/2016 | Robertson ........ H04N 21/44245 |
| 2017/0237492 A1* | 8/2017 | Mutalik ........... H04B 10/25751 398/72 |

OTHER PUBLICATIONS

Supplementery search report of EP16898533 issued by European Patent Office dated Aug. 9, 2019, 2 pages.
Search report of international application PCT/FI2016/050253 issued by Finnish Patent and Registration Office dated Sep. 1, 2016.

* cited by examiner

ARRANGEMENT FOR CATV NETWORK

PRIORITY

This application is a U.S. national application of the international application number PCT/FI2016/050253 filed on 15 Apr. 2016.

FIELD OF THE INVENTION

The invention relates to cable television (CATV) networks, and especially to an arrangement for adjusting frequency bands.

BACKGROUND OF THE INVENTION

CATV networks may be implemented with various techniques and network topologies, but currently most cable television networks are implemented as so-called HFC networks (Hybrid Fiber Coax), i.e. as combinations of a fibre network and a coaxial cable network. FIG. 1 shows the general structure of a typical HFC network. Program services are introduced from the main amplifier 100 (a so-called headend) of the network via an optical fibre network 102 to a fibre node 104, which converts the optical signal to an electric signal to be relayed further in a coaxial cable network 106. Depending on the length, branching, topology, etc. of the coaxial cable network, this coaxial cable segment typically comprises one or more broadband amplifiers 108, 110 for amplifying program service signals in a heavily attenuating coaxial media. From the amplifier the program service signals are introduced to a cable network 112 of a smaller area, such as a distribution network of an apartment building, which are typically implemented as coaxial tree or star networks comprising signal splitters for distributing the program service signals to each customer. From a wall outlet the signal is further relayed either via a cable modem 114 to a television receiver 116 or a computer 118, or via a so-called set-top box 120 to a television receiver 122.

Data Over Cable Service Interface Specification (DOCSIS) is a CATV standard providing specifications for high-bandwidth data transfer in an existing CATV system. The latest version DOCSIS 3.1 enables the cable network operators to maximize both the downstream and upstream data throughput using the existing HFC networks.

One issue relating to the introduction of DOCSIS 3.1 is the need to eventually adjust the frequency range and the bandwidth of the communication channels. The cable operators are willing to offer higher data rates for the upstream channels, and therefore they eventually will adjust the upstream bandwidth to a higher upstream bandwidth supported by DOCSIS 3.1.

The upper frequency edge of the upstream bandwidth is controlled by diplex filters residing in network elements. However, adjusting the frequency range and the bandwidth of the communication channels requires that maintenance personnel travels to each network element on the signal path, removes the old diplex filter and replaces it with a new diplex filter. Since the downstream signals pass the same diplex filters, there is a service breakdown both to and from each customer device locating along the downstream direction of the signal path for the time of the replacement. Moreover, it is obvious that such a replacement procedure is slow, costly and cumbersome.

BRIEF SUMMARY OF THE INVENTION

Now, an improved arrangement has been developed to reduce the above-mentioned problems. As aspects of the invention, we present a network element of a cable television network, which is characterized in what will be presented in the independent claims.

The dependent claims disclose advantageous embodiments of the invention.

According to an aspect of the invention, there is provided a network element of a cable television (CATV) network, said network element comprising an input for upstream signal transmission; at least two diplex filters configured to be connected to said input, a first diplex filter comprising a bandpass filter for a first upstream frequency band and a second diplex filter comprising a bandpass filter for a second upstream frequency band; a switch for connecting one of said at least two diplex filters to said input; the network element being configured to be remotely controlled by a headend of the CATV network for selecting the diplex filter.

According to an embodiment, an upper frequency edge of the first upstream frequency band is 42 or 65 MHz and an upper frequency edge of the second upstream frequency band is at least one of 85 MHz, 117 MHz or 204 MHz.

According to an embodiment, at least the second diplex filter is a plug-in filter.

According to an embodiment, the network element is configured to be remotely controlled by a uni-directional control signalling from the headend.

According to an embodiment, the network element further comprises a modem, wherein the network element is configured to be remotely controlled by a bi-directional control signalling from/to the headend.

According to an embodiment, the control signaling is carried out by using modems in accordance with DOCSIS or HMS (Hybrid Management Sublayer) standard or proprietary modems.

According to an embodiment, the network element is configured to adjust one or more of its operational parameters in accordance with the selected upstream frequency band.

According to an embodiment, the network element comprises a plurality of predefined settings stored in the network element for adjusting its operational parameters in accordance with the selected upstream frequency band, wherein the network element is configured to adjust the one or more operational parameters automatically in response to selecting another diplex filter.

According to an embodiment, the network element is configured to adjust the one or more operational parameters on the basis of the previous parameter values upon selecting another diplex filter.

According to an embodiment, the network element is configured to receive new operational parameters remotely from the headend or a corresponding control element.

These and other aspects, embodiments and advantages will be presented later in the detailed description of the invention.

BRIEF DESCRIPTION OF THE DRAWINGS

The invention will now be described in more detail in connection with preferred embodiments with reference to the appended drawings, in which.

DETAILED DESCRIPTION OF THE EMBODIMENTS

Data Over Cable Service Interface Specification (DOCSIS) is a CATV standard providing specifications for high-bandwidth data transfer in an existing CATV system. DOCSIS may be employed to provide Internet access over existing hybrid fiber-coaxial (HFC) infrastructure of cable television operators. DOCSIS has been evolved through versions 1.0, 1.1, 2.0 and 3.0 to the latest version of 3.1. DOCSIS provides a lucrative option for cable network providers to maximize both the downstream and upstream data throughput using the existing cable TV network, but without making expensive changes to the HFC network infrastructure.

Figure 1:
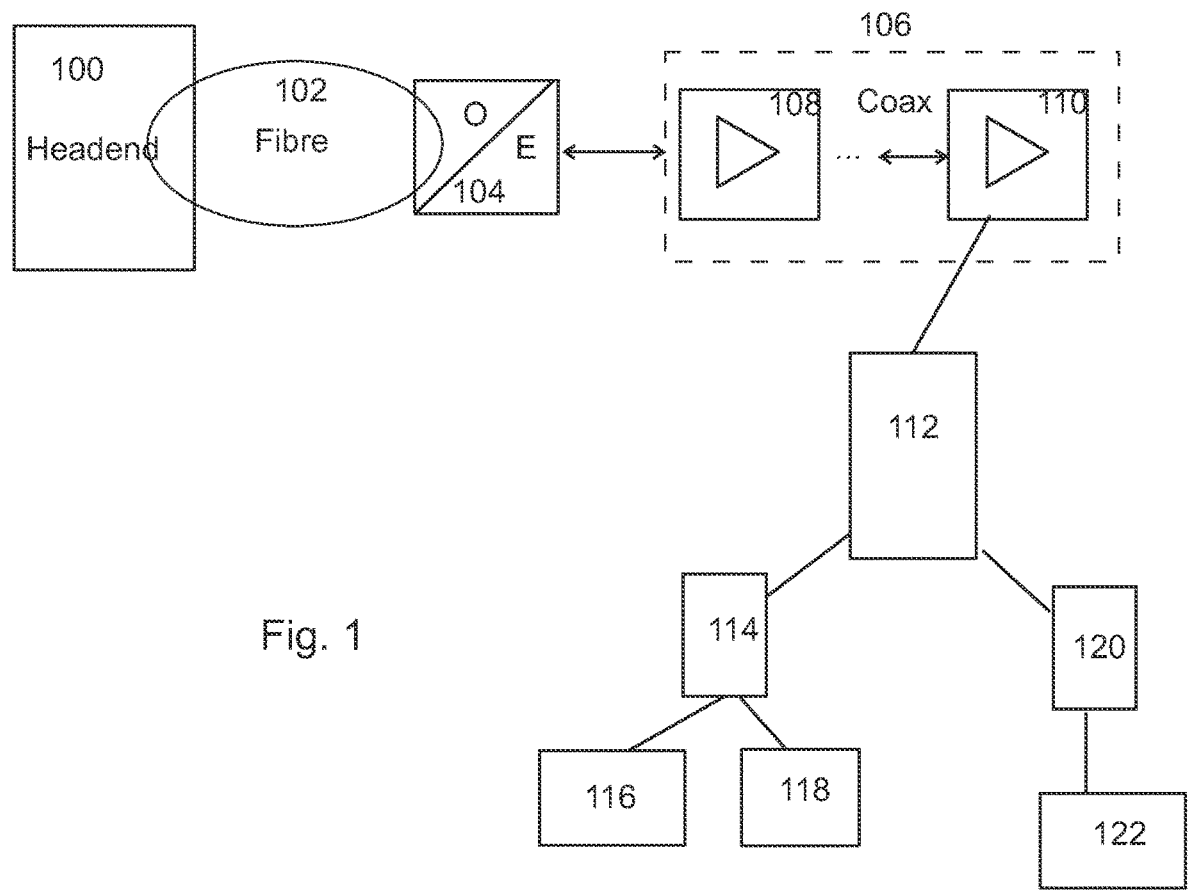
FIG. 1 shows the general structure of a typical HFC network.

When implementing the HFC network of FIG. 1 according to DOCSIS, the headend 100 of the CATV network comprises inputs for signals, such as TV signals and IP signals, a television signal modulator and a cable modem termination system (CMTS). The CMTS provides high-speed data services to customers thorough cable modems (CM; 114) locating in homes. The CMTS forms the interface to the IP-based network over the Internet. It modulates the data from the Internet for downstream transmission to homes and receives the upstream data from homes. The CMTS additionally manages the load balancing, error correction parameters and the class of service (CoS).

Signals from the headend 100 are distributed optically (fiber network 102) to within the vicinity of individual homes, where the optical signals are converted to electrical signals at the terminating points 104. The electrical signals are then distributed to the various homes via the existing 75 ohm coaxial cables 106. The maximum data transfer of the coaxial cables is limited due to strong frequency-based attenuation. Therefore, the electrical signals transmitted over coaxial cables must be amplified. The amplifiers 108, 110 used for this purpose are suited to a specific frequency range. In addition, the upstream and downstream must occur over the same physical connection. The last part 112 of the coaxial connection between the CMTS and the CMs branches off in a star or a tree structure. A CMTS transmits the same data to all CMs located along the same section of cable (one-to-many communications). A request/grant mechanism exists between the CMTS and the CMs, meaning that a CM needing to transmit data must first send a request to the CMTS, after which it can transmit at the time assigned to it.

Depending on the version of DOCSIS used in the CATV network, there is a great variety in options available for configuring the network. For the downstream channel width, all versions of DOCSIS earlier than 3.1 use either 6 MHz channels (e.g. North America) or 8 MHz channels (so-called "EuroDOCSIS"). However, the upstream channel width may vary between 200 kHz and 3.2 MHz (versions 1.0/1.1), and even to 6.4 MHz (version 2.0). 64-QAM or 256-QAM modulation is used for downstream data in all versions, but upstream data uses QPSK or 16-level QAM (16-QAM) for DOCSIS 1.x, while QPSK, 8-QAM, 16-QAM, 32-QAM, 64-QAM and 128-QAM are used for DOCSIS 2.0 & 3.0.

DOCSIS 3.1 specifications support capacities of at least 10 Gbit/s downstream and 1 Gbit/s upstream using 4096 QAM. DOCSIS 3.1 rejects the 6 or 8 MHz wide channel spacing and uses narrower orthogonal frequency-division multiplexing (OFDM) subcarriers being 20 kHz to 50 kHz wide, which sub-carriers can be combined within a block spectrum of about 200 MHz wide.

DOCSIS 3.1 further provides the concept of Distributed CCAP Architecture (DCA). Converged Cable Access Platform (CCAP) may be defined as an access-side networking element or set of elements that combines the functionality of a CMTS with that of an Edge QAM (i.e. the modulation), providing high-density services to cable subscribers. Conventionally, the CCAP functionalities have been implemented in the headend/hub, such as the headend 100 in FIG. 1. In a DCA, some features of the CCAP are distributed from headend/hub to the network elements closer to the customers, for example to the fibre nodes 104 in FIG. 1. DOCSIS 3.1 specifies at least two network element concepts, i.e. a Remote PHY Device (RPD) and a Remote-MACPHY Device (RMD), to which some functionalities of the headend can be distributed.

The data transmission between the distributed parts of the CCAP is typically carried out through a fiber connection. This may provide both scale advantages and flexible deployment options by maximizing the channel capacity and simplifying many operations via the usage of digital fiber and Ethernet transport.

While the implementation of DOCSIS 3.1 may provide many advantages in improving the channel capacity and the efficiency of the CATV networks, the fact is that the existing HFC network structures of the cable operators will be updated slowly and a great deal of the existing network elements will remain in use for a long time.

One issue relating to the introduction of DOCSIS 3.1 is the need to eventually adjust the frequency range and the bandwidth of the communication channels. The cable operators are willing to offer higher data rates for the upstream channels, and therefore they eventually will adjust the upstream bandwidth from 5-42 MHz (in Americas) or 5-65 MHz (in Europe) to a higher upstream bandwidth supported by DOCSIS 3.1. It is not mandatory to adjust, for example, the upper frequency edge of the upstream bandwidth immediately upon the introduction of DOCSIS 3.1, but in order to take full advantage of the improved channel capacity and efficiency the cable operators most probably are willing to take the maximum upstream bandwidth in use as soon as possible.

The increase in the upstream bandwidth means that the downstream bandwidth must be correspondingly decreased. The upper frequency edge of the upstream bandwidth and the lower frequency edge of the downstream bandwidth are controlled by diplex filters residing in network elements between the headend or the CMTS and the cable modems or other home premise devices. Network elements typically comprising such diplex filters include at least optical nodes and amplifiers. Regarding the existing network elements in the HFC networks, adjusting the frequency range and the bandwidth of the communication channels needs to be carried out manually. In other words, maintenance personnel needs to travel to each network element on the signal path, remove the old diplex filter and replace it with a new diplex filter. Hence, the replacement process, as such, is very slow and cumbersome.

Since the downstream signals pass the same diplex filters, there is a service breakdown both to and from each customer device locating along the downstream direction of the signal path for the time of the replacement. Considering the number of network elements comprising diplex filters along the signal path, each customer device may easily experience 10-20 service breakdowns due to the replacement of diplex filters.

Even if the introduction of DOCSIS 3.1 were to take place only in forthcoming years, the above problems would occur with newly introduced network elements, if not addressed properly in forehand.

Therefore, an improved procedure is needed for adjusting the bandwidth of the communication channels in CATV networks.

According to an aspect, a network element of a cable television (CATV) network is now introduced, said network element comprising an input for upstream signal transmission; at least two diplex filters configured to be connected to said input, a first diplex filter comprising a bandpass filter for a first upstream frequency band and a second diplex filter comprising a bandpass filter for a second upstream frequency bands; a switch for connecting one of said at least two diplex filters to said input; wherein the network element is configured to be remotely controlled by a headend of the CATV network for selecting the diplex filter.

Hereinafter, the term "headend" may refer to the conventional integrated headend/hub comprising all or a subset of the CCAP functionalities. The term "headend" may refer to a remote unit of an DCA, such as the RPD or the RMD, arranged to carry out at least a part of the CCAP functionalities. It is also possible that all CCAP functionalities are distributed to the remote node. It is noted that a CATV network may comprise several headends. There may be a central headend and one or more regional or sub-headends.

It is also noted that the bandpass filters herein may practically be lowpass filters allowing upstream signals having frequency between 0 Hz and an upper frequency edge of the upstream frequency band pass the filter. However, other constraints of the CATV networks raise the lower frequency edge of the upstream frequency band above 0 Hz, for example to 5 MHz.

Thus, while anticipating the introduction of DOCSIS 3.1, the existing or the newly updated network elements may be provided with at least two diplex filters, wherein at least one diplex filter comprises a bandpass filter for a first frequency band, i.e. the old or the existing frequency band, and at least another diplex filter comprises a bandpass filter for a second upstream frequency band, i.e. the new frequency band according to DOCSIS 3.1. The network element may be provided with a switch or a corresponding logic for selecting the diplex filter to be used and for connecting the selected diplex filter to the input such that the upstream signal path travels through the selected filter. The network element is configured to receive remote control signaling from the headend of the CATV network, and according to the signaling, the network element controls the switch or the corresponding logic for selecting the desired diplex filter.

Accordingly, the service breakdowns experienced by the customer devices can be minimized, or possibly totally avoided. Also the costs relating to the work needed to adjust the frequency range and the bandwidth of the communication channels can be significantly reduced, as well as the duration of the frequency update process in the whole CATV network.

It is noted that while the discussion herein relates to adjusting the frequency band of the upstream signals, a skilled person readily appreciates that this may, and in most cases will, affect to the frequency band of the downstream signals, as well. However, at its simplest this may mean that the lower frequency edge of the downstream frequency band is adjusted such that it is higher than the upper frequency edge of the upstream frequency band, i.e. there is no overlap between downstream and the upstream frequency bands.

According to an embodiment, an upper frequency edge of the first upstream frequency band is 42 or 65 MHz and an upper frequency edge of the second upstream frequency band is at least one of 85 MHz, 117 MHz or 204 MHz. Thus, the network element comprises the first diplex filter arranged to operate the upstream channels within the existing frequency band (5-42 MHz typically in Americas, 5-65 MHz in Europe). The network element also comprises at least one, possibly several further diplex filters arranged to operate the upstream channels within any of the higher frequency bands supported in the DOCSIS 3.1 specification. Hence, the network element may comprise a second diplex filter arranged to operate the upstream channels within the frequency band below 85 MHz, a third diplex filter arranged to operate the upstream channels within the frequency band below 117 MHz, and a fourth diplex filter arranged to operate the upstream channels within the frequency band below 204 MHz. The switch or the corresponding logic may be then controlled to select one of the available diplex filters.

It is noted that the frequency bands may also be different than what is stated above. It is known that some existing HFC network have been implemented as having upper frequency edge of the first upstream frequency band as 50 or 55 Mhz, for example. Moreover, when the standards evolve in the future, the upper frequency edge of the second upstream frequency band may differ from those stated in the current DOCSIS 3.1 specification.

According to an embodiment, at least the second diplex filter is a plug-in filter. By using plug-in filters instead of filters assembled on the PCB, the existing network elements may be easily provided with the further diplex filters for the new frequency bands. In the manufacturing process, the further diplex filters may be easily included in the existing models without significant changes in network element design. Thus, the network elements offered to the cable operators already include the necessary diplex filters both for the current upstream frequency band and the forthcoming upstream frequency band.

On the other hand, plug-in filters may be installed to the network elements of the existing HFC network without causing any service breakdown. Even if extra manual work is required to install the further diplex filters and possible switch arrangements, the serious problem of service breakdowns can be avoided.

According to an embodiment, the network element is configured to be remotely controlled by a uni-directional control signalling from the headend. Herein, a proprietary (vendor-specific) signaling solution may be used. For example, many network element vendors provide their own proprietary FSK (Frequency Shift Keying) signaling solution for controlling the network elements from the headend.

According to an embodiment, the network element further comprises a modem, wherein the network element is configured to be remotely controlled by a bi-directional control signalling from/to the headend. For managing the network elements by using two-way communication from/to the headend, the control signaling is typically carried out by using modems in accordance with DOCSIS or HMS (Hybrid Management Sublayer) standard or proprietary modems.

According to an embodiment, the network element is configured to adjust one or more of its operational parameters in accordance with the selected upstream frequency band. One example of the operational parameters is the amplification of the upstream signal. According to an embodiment, the network element may comprise a plurality of predefined settings stored in the network element for adjusting its operational parameters, such as the amplification of the upstream signal, in accordance with the selected upstream frequency band, whereupon the operational parameters are adjusted automatically in response to selecting another diplex filter. According to another embodiment, the one or more operational parameters may be adjusted, e.g. calculated, on the basis of the previous parameter values upon switching to the new upstream frequency band.

According to an embodiment, if the adjustment of the operational parameters at the network element fails for some reason, the new operational parameters can be sent remotely by the headend or a corresponding control element to the network element.

Figure 2:
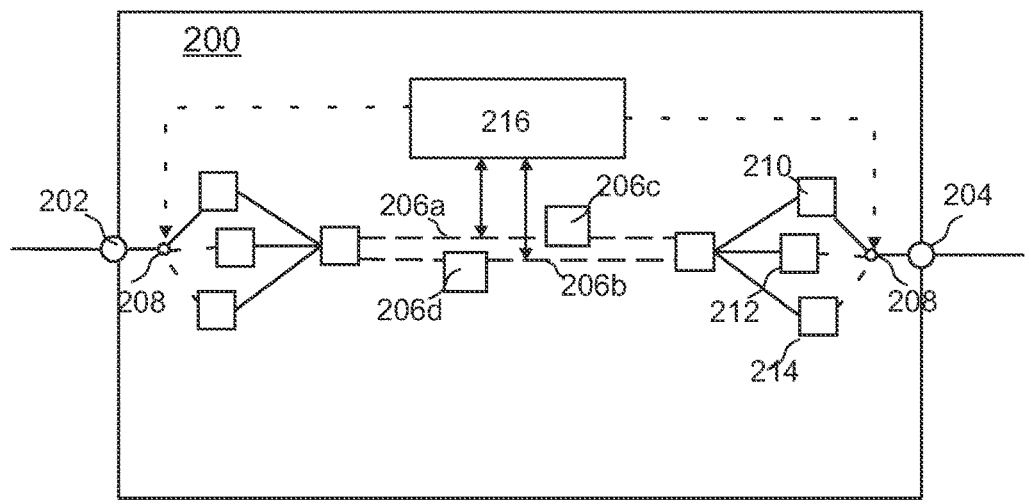
FIG. 2 shows a simplified block chart of a network element according to an embodiment of the invention.

FIG. 2 shows a simplified block chart of a network element, wherein the embodiments may be implemented. In FIG. 2, an amplifier is used as an example of the network element, but the embodiments are similarly applicable to any network elements requiring the adjustment of the upstream frequency band and residing between the headend or the CMTS and the cable modems or other home premise devices, such as various optical nodes.

The amplifier 200 comprises a first input/output port 202, which operates as an input for the downstream signals originating from the headend or the CMTS and an output for the upstream signals originating from the customer devices. The amplifier 200 further comprises a second input/output port 204, which operates as an output for the downstream signals originating from the headend or the CMTS and an input for the upstream signals originating from the customer devices. Within the amplifier the downstream and upstream signals have their own signal routes 206a, 206b travelling at least partly through different components, including attenuators, signal inclination controllers, amplifiers, etc. Most of the internal structure of the network element is irrelevant for the implementation of the embodiments, and therefore the internal structure is not described in further detail, but only depicted by the dotted lines 206a, 206b referring to the signal routes and components 206c, 206d referring to the components along the corresponding signal routes.

Regarding the second input/output port 204 and the upstream signals originating from the customer devices, there is a switch 208 for directing the upstream signals to a diplex filter. The amplifier comprises a first diplex filter 210 arranged to provide the first (existing) upstream frequency band (an upper frequency edge of 42 or 65 MHz, for example). The amplifier further comprises a second diplex filter 212 arranged to provide the second upstream frequency band (an upper frequency edge of 85 MHz, 117 MHz or 204 MHz). The amplifier may further comprise a third (or even a fourth) diplex filter 214 arranged to provide the third (or fourth) upstream frequency band, wherein the upper frequency edge is one of 85, 117 or 204 MHz and not provided by the second (or the third) diplex filter.

The amplifier comprises a communication unit 216 for receiving remote control signaling from the headend of the CATV network via the downstream signal route. At the simplest, the control signaling may be uni-directional control signaling from the headend, e.g. proprietary FSK signaling. According to the received signaling, the communication unit 214 controls the switch 208 to select the desired diplex filter.

In a more sophisticated solution, the communication unit 216 may comprise a transponder unit capable of bi-directional communication with the headend and a processor for interpreting the control signaling. The transponder unit may comprise modems in accordance with DOCSIS or HMS standard or proprietary modems. Again, according to the received signaling, the communication unit 216, more precisely the processor, controls the switch 208 to select the desired diplex filter.

From the selected diplex filter, the upstream signal is directed back to the upstream signal route and its corresponding components. It is noted that in case that the upstream and downstream signals use the same nodes as input/output ports, as shown in FIG. 2, a similar but a mirrored (in upstream signal route direction) arrangement of a plurality of diplex filter and a switch shall be provided in connection with the first input/output port 202. The communication unit 216 shall then control both switches to select the corresponding diplex filters.

The communication unit 216 may also adjust other parameters of the amplifier to be more optimal in view of the selected upstream frequency band. For example, if the components 206c, 206d along the upstream and downstream signal routes were amplification units, the communication unit 216 may adjust the amplification of at least the upstream signal, but possibly also the amplification of the downstream signal.

In general, the various embodiments may be implemented in hardware or special purpose circuits or any combination thereof. While various embodiments may be illustrated and described as block diagrams or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

A skilled person appreciates that any of the embodiments described above may be implemented as a combination with one or more of the other embodiments, unless there is explicitly or implicitly stated that certain embodiments are only alternatives to each other.

The various embodiments can be implemented with the help of computer program code that resides in a memory and causes the relevant apparatuses to carry out the invention. Thus, the implementation may include a computer readable storage medium stored with code thereon for use by an apparatus, such as the network element, which when executed by a processor, causes the apparatus to perform the various embodiments or a subset of them. Additionally or alternatively, the implementation may include a computer program embodied on a non-transitory computer readable medium, the computer program comprising instructions causing, when executed on at least one processor, at least one apparatus to apparatus to perform the various embodiments or a subset of them. For example, an apparatus may comprise circuitry and electronics for handling, receiving and transmitting data, computer program code in a memory, and a processor that, when running the computer program code, causes the apparatus to carry out the features of an embodiment.

It will be obvious for a person skilled in the art that with technological developments, the basic idea of the invention can be implemented in a variety of ways. Thus, the invention and its embodiments are not limited to the above-described examples but they may vary within the scope of the claims.

The invention claimed is:

1. A network element of a cable television (CATV) network, said network element comprising:
an input for upstream signal transmission;
at least two diplex filters configured to be connected to said input, a first diplex filter comprising a bandpass filter for a first upstream frequency band and a second diplex filter comprising a bandpass filter for a second upstream frequency band, wherein at least the second diplex filter is a plug-in filter;
a switch for connecting one of said at least two diplex filters to said input; and
the network element being configured to be remotely controlled by a headend of the CATV network for selecting the diplex filter, wherein the network element comprises a plurality of predefined settings stored in the network element for adjusting at least amplification of the upstream signal in accordance with the selected upstream frequency band, and wherein the network element is configured to adjust at least the amplification of the upstream signal automatically in response to selecting another diplex filter.

2. The network element according to claim 1, wherein an upper frequency edge of the first upstream frequency band is 42 or 65 MHz and an upper frequency edge of the second upstream frequency band is at least one of 85 MHz, 117 MHz or 204 MHz.

3. The network element according to claim 1, wherein the network element is configured to be remotely controlled by a uni-directional control signalling from the headend.

4. The network element according to claim 1, further comprising a modem, wherein the network element is configured to be remotely controlled by a bi-directional control signalling from/to the headend.

5. The network element according to claim 4, wherein the control signaling is carried out by using modems in accordance with DOCSIS or HMS (Hybrid Management Sublayer) standard or proprietary modems.

6. The network element according to claim 1, wherein the network element is configured to adjust the one or more operational parameters on the basis of the previous parameter values upon selecting another diplex filter.

7. The network element according to claim 1, wherein the network element is configured to receive new operational parameters remotely from the headend or a corresponding control element.

* * * * *